United States Patent [19]

Norioka

[11] 4,417,145
[45] Nov. 22, 1983

[54] APPARATUS FOR CONTROLLING MAGNETIC FIELD INTENSITY

[75] Inventor: Setsuo Norioka, Akishimashi, Japan

[73] Assignee: JEOL Ltd., Tokyo, Japan

[21] Appl. No.: 305,404

[22] Filed: Sep. 25, 1981

[30] Foreign Application Priority Data

Sep. 26, 1980 [JP] Japan ............................ 55-133888

[51] Int. Cl.³ .................... G21K 1/08; H01J 37/00
[52] U.S. Cl. ........................ 250/396 ML; 328/230
[58] Field of Search ............... 250/396 R, 396 ML; 328/230; 313/361

[56] References Cited

U.S. PATENT DOCUMENTS 3,911,321 10/1975 Wordly ...................... 250/396 ML

FOREIGN PATENT DOCUMENTS 2449000 7/1975 Fed. Rep. of Germany ...... 250/396 ML

Primary Examiner—Bruce C. Anderson
Attorney, Agent, or Firm—Webb, Burden, Robinson & Webb

[57] ABSTRACT

A control apparatus according to this invention is installed between an intensity specifying circuit and an excitation current source for a magnetic lens or deflecting coil. The intensity specifying circuit generates a target signal (B) corresponding to the desired magnetic flux density (B) in a magnetic lens or deflecting coil. The excitation current source outputs a current (I) which produces the desired flux density (B). Due to the effects of hysteresis the ferromagnetic yoke adjacent the lens or deflecting coil, the relationship between the target signal (B) and current (I) is nonlinear. The control apparatus has a memory in which data defining the hysteresis characteristics of the lens or coil being controlled has been stored. The control means saves the present intensity specifying signal (the old target signal) and the most recent reverse-value signal (the last target signal proceeded and followed by target signals, both of which are higher or both of which are lower than the reverse-value signal) and with the new target signal calculates the change in current ($\Delta I$) required to produce the desired flux density and commands the excitation current source to output the corresponding current. The effects due to hysteresis of the ferromagnetic yoke are dealt with by the control apparatus facilitating computer control of the electromagnetic lens or deflecting means.

4 Claims, 3 Drawing Figures

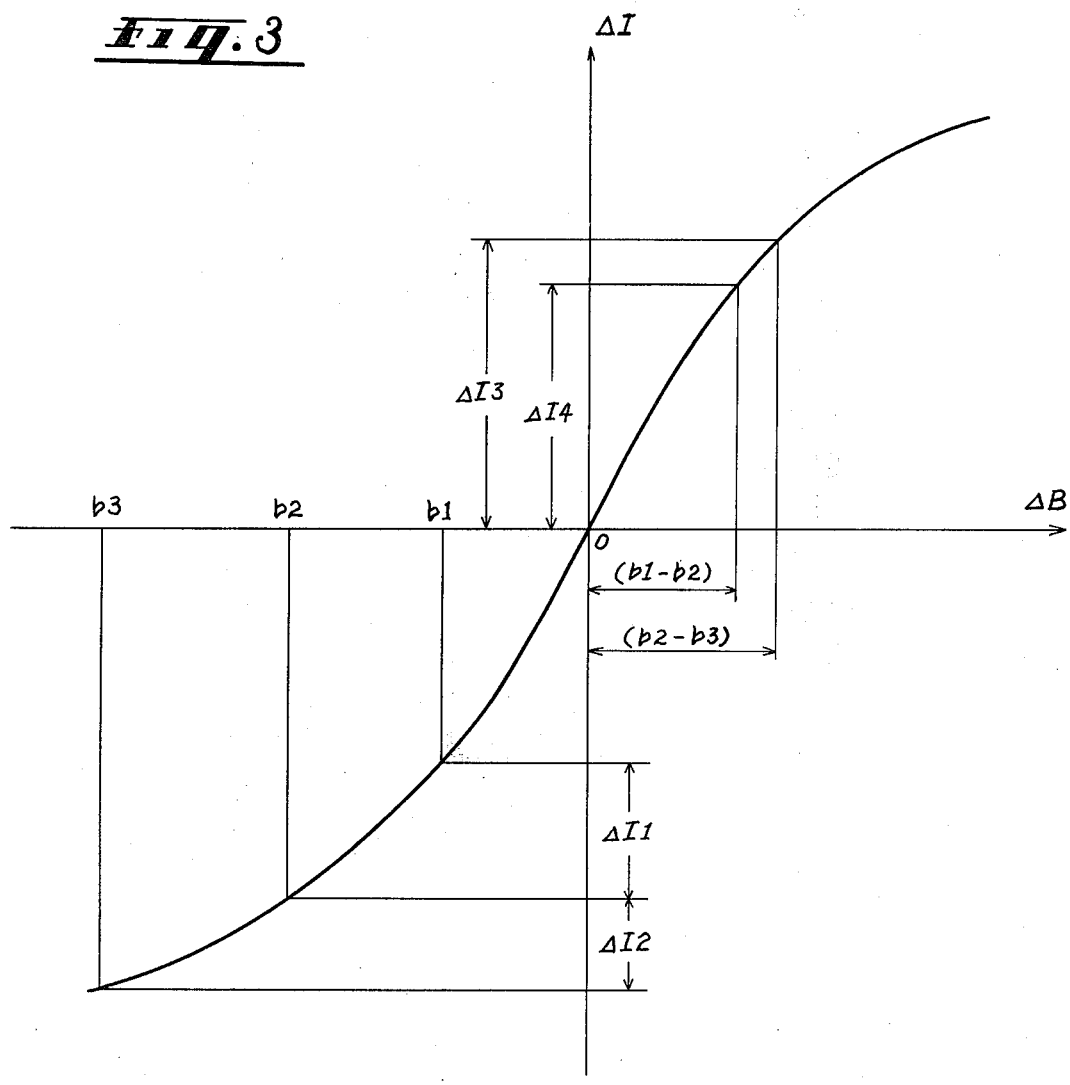

APPARATUS FOR CONTROLLING MAGNETIC FIELD INTENSITY

BACKGROUND OF THE INVENTION

This invention relates to an apparatus for controlling magnetic field intensity of electromagnetic lenses or charged particle beam deflection means used in a charged particle beam apparatus such as an electron microscope, an X-ray microanalyzer, a device for electron beam exposure, or other similar charged particle beam devices.

Electromagnetic lenses and deflecting means in an X-ray microanalyzer and the like incorporate ferromagnetic yokes disposed adjacent to the excitation coils through which coils the excitation current flows. Different lens powers (focal lengths) or deflection powers may be obtained with the very same excitation current supplied to the same lens coils or deflection coils, because of the hystersis of the ferromagnetic yokes. Therefore, it is necessary to deal with the effect due to the hysteresis of the lens or deflection means when the apparatus is to be controlled by a computer.

SUMMARY OF THE INVENTION

It is an object of the present invention to provide a novel apparatus for controlling electromagnetic lens or deflecting means so as to eliminate the undesired effects due to the hysteresis of the ferromagnetic yoke.

A control apparatus according to the present invention, outputs a control signal for controlling the excitation current source for the lens coil or deflection coil. The control apparatus produces the control signal by use of the value of a target specifying input signal (supplied new from the field intensity specifying means) and the values of previous input signals (supplied from the said field intensity specifying means). The previous input signals used are the present intensity specifying signal (the old target signal) and the most recent reverse-value signal (the last target signal proceeded and followed by signals which are either both higher or both lower than the reverse-value signal). The control apparatus has stored therein data defining the hysteresis characteristics of the lens or coil being controlled. The data defines change in excitation current ($\Delta I$) required for the change in the command signal ($\Delta B$) to produce the desired changes in flux density ($\Delta B$). (See FIG. 3). The function, generally speaking, passes through the origin ($\Delta I=0$, $\Delta B=0$) and defines positive values of ($\Delta I$) for positive values of ($\Delta B$) and negative values of ($\Delta I$) for negative values of ($\Delta B$). The derivative of the function ($\Delta I=f(\Delta B)$) defined by the data is large near the origin and diminishes moving away from the origin. When a flux density (B) is desired, the intensity specifying circuit issues a new target signal (B). In response to the new target signal, the control apparatus first determines if the present target signal was a reverse-value signal and if the reversal was from increasing current to decreasing current, or vice versa. Assuming the last target signal was a reverse-value signal, the change in ($\Delta B$) (difference between new target and old target signal) is calculated and used to ascertain the change in current ($\Delta I$) required by direct reference to the stored data. The change ($\Delta B$) can be either positive or negative resulting in positive or negative ($\Delta I$) values. The present value of current (I) in the coil (i.e., the present output) is modified by summing with the ($\Delta I$) value to bring about the desired flux density value (B). If a present value is not a reverse-value signal, the ($\Delta I$) value for the new target signal (calculated from a last reverse-value signal) is reduced by the ($\Delta I$) value for the present target signal (calculated from the last reverse-value signal). The reduced ($\Delta I$) value is summed with the present current source output (I) to produce the desired flux density (B).

BRIEF DESCRIPTION OF THE DRAWINGS

FIGS. 2 and 3 are graphs for explaining the principle of this invention.

DETAILED DESCRIPTION OF THE INVENTION

Figure 1:
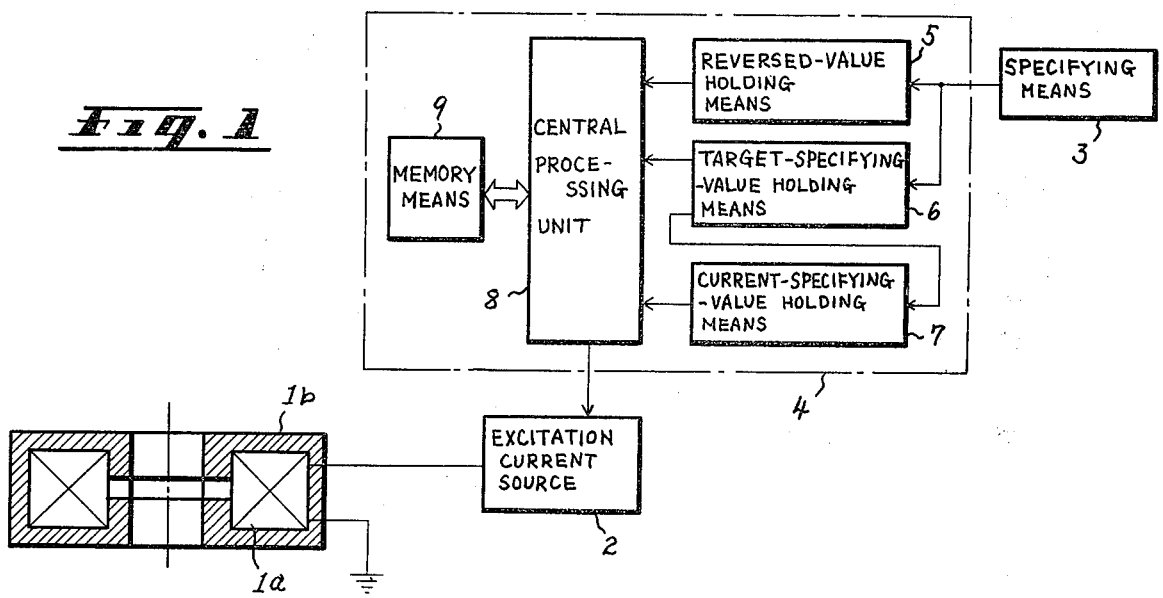
FIG. 1 is a block diagram of one embodiment according to this invention.

FIG. 1 shows one embodiment of this invention. In the figure, a lens coil 1a is surrounded by ferromagnetic yoke 1b. The lens coil 1a is supplied with the output from an excitation current source 2. The excitation current source 2 is controlled by a control signal from a control signal generating means 4. The output from a field intensity specifying means 3 for specifying a lens power (focal length or magnetic field intensity) is supplied to the control signal generating means 4. The field intensity specifying means 3 produces an output signal B corresponding to a magnetic flux density (B) in gaps between magnetic pole pieces of the ferromagnetic yoke 1b for specifying a desired focal length of the lens. The control signal means 4 receives the output signal B and instructs the excitation current source 2. The control generating means 4 comprises a reverse-signal-value holding circuit 5 for detecting and storing an updated signal value $b_o$ when the value of specifying signals successively applied from the specifying circuit 3 is changed from an increasing to a decreasing trend or from a decreasing to an increasing trend; a target-specifying-signal-value holding circuit 6 for holding an updated specifying or target signal $b_2$; and a current-specifying-signal-value holding circuit 7 for holding a specifying signal value $b_1$ immediately before the updated specifying signal is applied. The holding circuits 5, 6, 7 may, for example, comprise sample and hold circuits for analog signals or registers for digital signals. A central processing unit 8 collates the signals $b_0$, $b_1$ and $b_2$ with data stored in a memory means 9 and, based on the results, supplies a control signal to the excitation current source 2 to supply the lens coil 1a with such an excitation current so as to generate a magnetic flux (B) corresponding to the specifying signal $b_2$.

Figure 2:
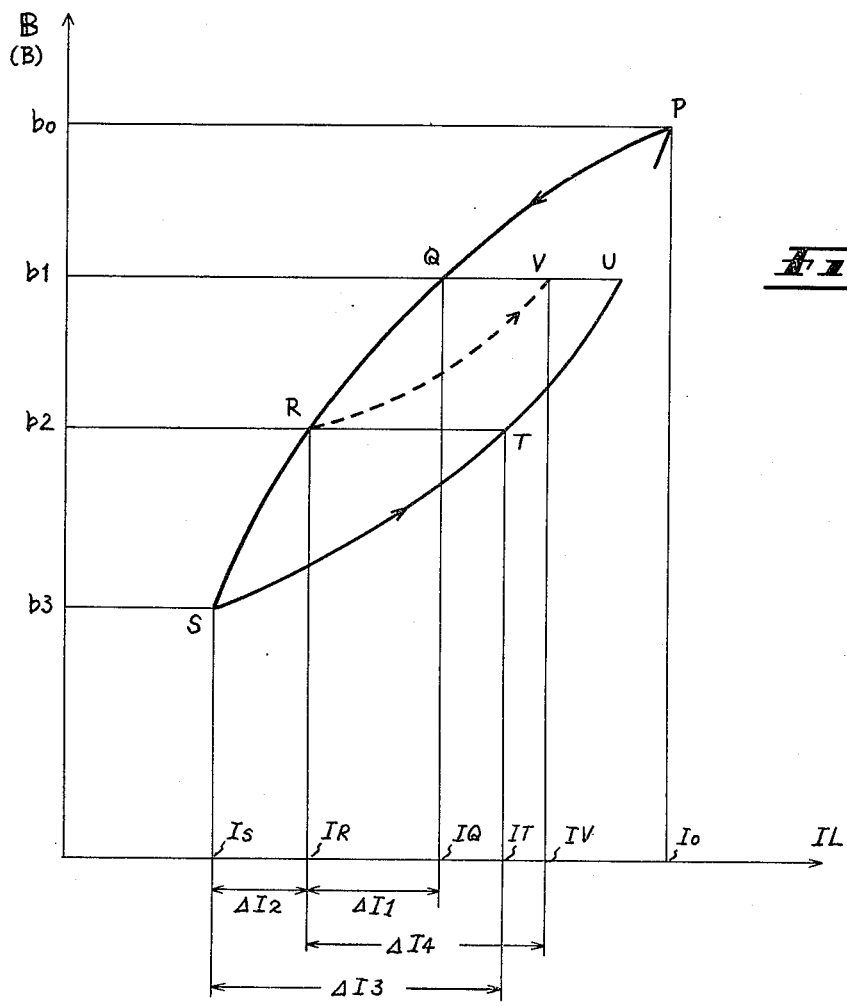

FIG. 2 shows a hysteresis characteristic curve called a minor loop for the ferromagnetic yoke 1b with the horizontal axis indicating the intensity (IL) of the excitation current supplied to the lens coil 1a and the vertical axis indicating the magnetic flux density (B) in the magnetic lens or the output (B) from the field intensity specifying means 3 which corresponds to the magnetic flux density (B).

It is now assumed that the specifying means 3 is actuated to change the signal so that it is increased from a value, say, below $b_0$ up the value $b_0$ and is next reduced down to the current value $b_1$ (i.e., the excitation current (IQ)), and then reaches the target value $b_2$, as indicated by the curve PQR. The value $b_0$ is a reverse-value signal since it comprises either a local maxima or minima. At this time, the three registers 5, 6, and 7 hold specifying values $b_0$, $b_2$, and $b_1$, respectively. This corresponds to Condition I as summarized in Table 1.

TABLE 1

| Conditions | I | II | III | IV |
|---|---|---|---|---|
| Reverse-value (holding circuit 5) | $b_0$ | $b_0$ | $b_3$ | $b_2$ |
| Target-specifying-value (holding circuit 6) | $b_2$ | $b_3$ | $b_2$ | $b_1$ |
| Current-specifying-value (holding circuit 7) | $b_1$ | $b_2$ | $b_3$ | $b_2$ |

The memory means stores beforehand-measured data the content of which is shown in FIG. 3. In FIG. 3, the horizontal axis indicates a change ($\Delta B$) in the specifying signal, including polarity, with the origin (0,0) being the value of reversal when the output from the specifying means 3 is changed from an increasing to a decreasing trend or from a decreasing to an increasing trend. The vertical axis indicates at ($\Delta I$) a change in the excitation current for the lens coil necessary to give ($\Delta B$). The form of the characteristic curve illustrated in FIG. 3 is intrinsic in electromagnetic lenses having associated ferromagnetic yokes and is obtained from the lens actually used.

Since the specifying signal (B) is caused to change from the value $b_1$ to the value $b_2$ (see FIG. 2) with the reversal value $b_0$ at the origin of $\Delta B$ under the said condition I, the central processing unit 8 computes such that $\Delta I$ should only be changed for an amount of $\Delta I_1$. As a result, the control signal of $\Delta I_1$ is supplied to the excitation current source 2, causing the excitation current to vary from IQ to IR.

When the output from the specifying means 3 is continuously reduced to the specifying value $b_3$ (condition II) after the condition I, the excitation current is changed by $\Delta I_2$ to IS.

Under the condition III in which the output of the specifying means 3 is returned again to the specifying value $b_2$, the specifying value is changed from $b_2$ to $b_3$ to $b_2$ and hence the value of the signal stored in the reversal-signal-value holding circuit 5 is changed from $b_0$ to $b_3$, whereupon the value of the signal held in the target-signal-value holding circuit 6 becomes $b_2$, and the value of the signal held in the current-specifying-signal-value holding circuit 7 becomes $b_3$. Therefore, the central processing unit 8 computes a change $\Delta I_3$ in the excitation current corresponding to a change ($b_2$-$b_3$) from the origin of $b_3$ in FIG. 3 and, based on the result, supplies a control signal to the excitation current source 2, causing the excitation current to take the value of IT in FIG. 2.

In the meanwhile, under the condition IV in which the output from the specifying means is changed from $b_0$ to $b_2$ and then to the new specifying value $b_1$, the reversal-signal-value holding means 5, the target-specifying-signal-value holding means 6 and the current-specifying-signal-value holding means 7, hold the signals $b_2$, $b_1$, and $b_2$, respectively. Therefore, the central processing unit 8 computes a change $\Delta I_4$ in the excitation current corresponding to a change ($b_1$-$b_2$) from the origin of $b_2$ in FIG. 3 and, based on the result, supplies a control signal to the excitation current source 2, causing the excitation current to take the value of IV in FIG. 2.

As described above, weakened excitation is carried out by controlling the excitation current along an upwardly convex portion (for example, PQRS) of the hysteresis curve of FIG. 2, and increased excitation is carried out by controlling the excitation current along downwardly concave portions (for example, RV, STU) of the hysteresis curve, whereby a desired lens power can be reached with precision without being adversely affected by hysteresis of the ferromagnetic yoke.

When the apparatus shown in FIG. 1 is started up, it is necessary to effect a special operation manually or automatically to maintain a starting point of the hysteresis curve shown in FIG. 2 at a constant point.

The present invention is applicable to an electromagnetic deflecting means which deflects a beam of electrons in an X-ray microanalyzer or the like, as well as to electromagnetic lens. More specifically, on condition that I is a current supplied to the electromagnetic deflecting means and B is a magnetic flux density corresponding to an amount B by which an electron beam is to be deflected, the electron beam can be shifted from one point to another with precision and without being adversely affected by magnetic hysteresis.

Having thus described the invention with the detail and particularity required by the Patent Laws, what is desired protected by Letters Patent is set forth in the following claims.

I claim:

1. In a device for producing a magnetic field comprising an electromagnetic coil and hysteretic yoke associated therewith, a control apparatus for receiving target signals indicative of a desired flux density and producing an output signal for controlling the current source to produce the desired flux density said control apparatus comprising a memory in which data defining the hysteretic characteristics of the yoke are stored;
means for holding a new target signal;
means for holding present and past target signals; and
means for collating the new target signal, the present and past target signals and comparing to the data in the memory to generate an output signal for controlling the current source.

2. A device according to claim 1 wherein the said control signal generating means comprises:

a target-specifying-value holding circuit for holding the newest output signal from the said specifying means.
a current-specifying-value holding circuit for holding the current specifying signal occuring immediately before the said target specifying signal is produced by the said specifying means, and
a reverse-value holding circuit for holding the specifying signal as it changes from an increasing to a decreasing trend or from a decreasing to an increasing trend before the said target specifying signal is produced.

3. A device according to claim 2 wherein the data store in memory defines the relationship between change in output signal for controlling the current and the change in specified magnetic flux density.

4. A device according to claim 3 wherein the change in specified magnetic flux density is measured relative to the last reverse-current target-specifying-signal and that change is used to produce the change in output signal for controlling the current.

* * * * *